(12) United States Patent
Chen et al.

(10) Patent No.: US 9,519,939 B2
(45) Date of Patent: Dec. 13, 2016

(54) SMART SWITCH AND SMART HOME SYSTEM USING THE SAME

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Te-Sheng Chen, New Taipei (TW); Xiao-Guang Li, Shenzhen (CN); Kuan-Hong Hsieh, New Taipei (TW); Yun Xiao, Shenzhen (CN); Shang-Hui Pi, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 456 days.

(21) Appl. No.: 13/975,394

(22) Filed: Aug. 26, 2013

(65) Prior Publication Data

US 2014/0067143 A1 Mar. 6, 2014

(30) Foreign Application Priority Data

Aug. 31, 2012 (CN) .......................... 2012 1 0317964

(51) Int. Cl.
*G06Q 50/06* (2012.01)
*G01R 21/133* (2006.01)
*G01R 22/06* (2006.01)

(52) U.S. Cl.
CPC ............. *G06Q 50/06* (2013.01); *G01R 21/133* (2013.01); *G01R 22/063* (2013.01);
(Continued)

(58) Field of Classification Search
CPC .......... G06F 1/26; G06F 1/266; G06F 1/3203; G06F 1/3287; G06F 2200/261; Y02B 60/1278; Y02B 60/1282; Y02B 60/1296; Y02B 90/241; Y02B 90/244; Y02B 90/245; Y04S 20/32; Y04S 20/327; Y04S 20/40; Y04S 20/46; H02J 3/14; H02J 2003/143; H02J 3/002; G06Q 50/06
See application file for complete search history.

(56) References Cited

U.S. PATENT DOCUMENTS 8,301,271 B2 * 10/2012 Lee ..................... G06F 1/3203
700/18
8,494,686 B2 * 7/2013 Masters .................. G06F 1/26
700/292
(Continued)

FOREIGN PATENT DOCUMENTS

CN 102306954 A 1/2012
CN 202351676 U 7/2012
(Continued)

*Primary Examiner* — Crystal J Barnes-Bullock
(74) *Attorney, Agent, or Firm* — ScienBiziP, P.C.

(57) ABSTRACT

A smart switch applied to a smart home system is connected to a power supply and at least one electronic device. The smart switch includes a screen, a power detecting unit configured to detect real-time electrical information of the electronic device, a processor unit including a calculating module configured to calculate total electricity consumption of the electronic device and a control module configured to control the screen to display instantaneous electrical information and the total electricity consumption, and a communication unit configured to connect the smart switch to a gateway of the smart home system in wired or wireless manner, and send the electrical information and the total electricity consumption to the gateway. A smart home system is also provided.

19 Claims, 6 Drawing Sheets

(52) U.S. Cl.
CPC ..... *G06F 2200/261* (2013.01); *Y02B 60/1296* (2013.01); *Y02B 90/241* (2013.01); *Y02B 90/245* (2013.01); *Y04S 20/32* (2013.01); *Y04S 20/40* (2013.01)

(56) References Cited

U.S. PATENT DOCUMENTS

| | | | | |
|---|---|---|---|---|
| 8,564,279 | B2* | 10/2013 | Johnson | H01R 13/6633 324/127 |
| 8,666,560 | B2* | 3/2014 | Lu | H04L 12/2807 323/234 |
| 8,793,029 | B2* | 7/2014 | Fausak | G01D 4/002 700/276 |
| 9,013,283 | B1* | 4/2015 | Tackaberry | G06Q 10/08 340/12.22 |
| 9,135,394 | B2* | 9/2015 | Joo | G06F 19/00 |
| 9,146,549 | B2* | 9/2015 | Pernia | G05B 15/02 |
| 2005/0203647 | A1 | 9/2005 | Landry et al. | |
| 2010/0100253 | A1* | 4/2010 | Fausak | G01D 4/002 700/295 |
| 2010/0109619 | A1 | 5/2010 | Tsou et al. | |
| 2012/0046890 | A1* | 2/2012 | Pennington | G01D 4/002 702/61 |
| 2012/0086272 | A1* | 4/2012 | Chen | H02H 3/027 307/38 |
| 2012/0143539 | A1* | 6/2012 | Krause | G01D 4/002 702/62 |
| 2013/0338844 | A1* | 12/2013 | Chan | H01R 13/6683 700/295 |
| 2014/0088779 | A1* | 3/2014 | Chen | H02J 4/00 700/295 |
| 2014/0163746 | A1* | 6/2014 | Drew | F24F 11/0086 700/276 |
| 2014/0188294 | A1* | 7/2014 | Hassin | G01D 4/002 700/286 |

FOREIGN PATENT DOCUMENTS

| | | |
|---|---|---|
| TW | 201019562 A | 5/2010 |
| TW | M418472 U1 | 12/2011 |

* cited by examiner

SMART SWITCH AND SMART HOME SYSTEM USING THE SAME

BACKGROUND

1. Technical Field

The present disclosure relates to smart home technology, and particularly to a smart switch and a smart home system employing the smart switch.

2. Description of Related Art

A manual switch may be always arranged on a wall or floor of the house for turning on/off the power of electronic devices. Some switches also include sockets and indicator light configured to indicate power states. However, that function of the switch is only a single one, and the common switch could obtain and calculate electricity consumption and other parameters.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

The disclosure, including the accompanying, is illustrated by way of example and not by way of limitation. It should be noted that references to "an" or "one" embodiment in this disclosure are not necessarily to the same embodiment, and such references mean "at least one."

Figure 1:
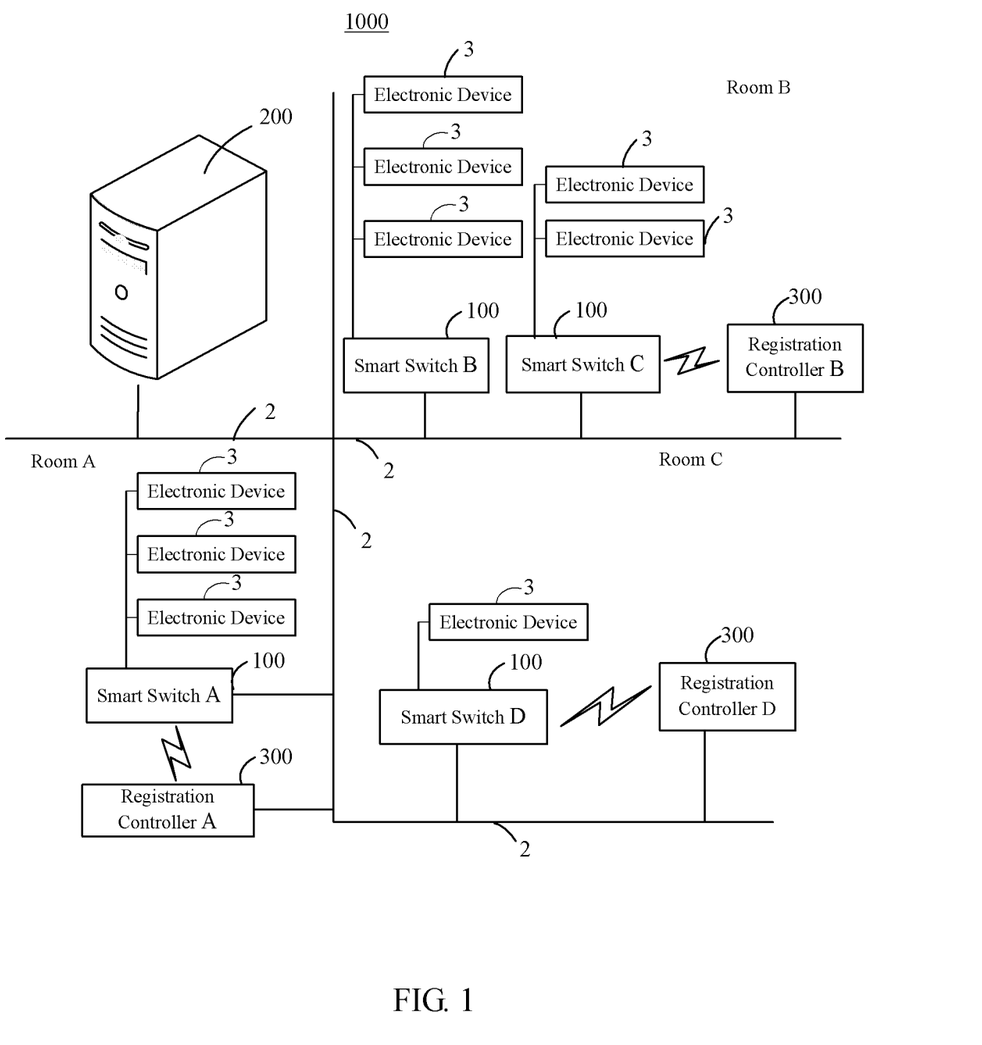
FIG. 1 is a schematic view showing a smart home system, according to an exemplary embodiment.
Figure 2:
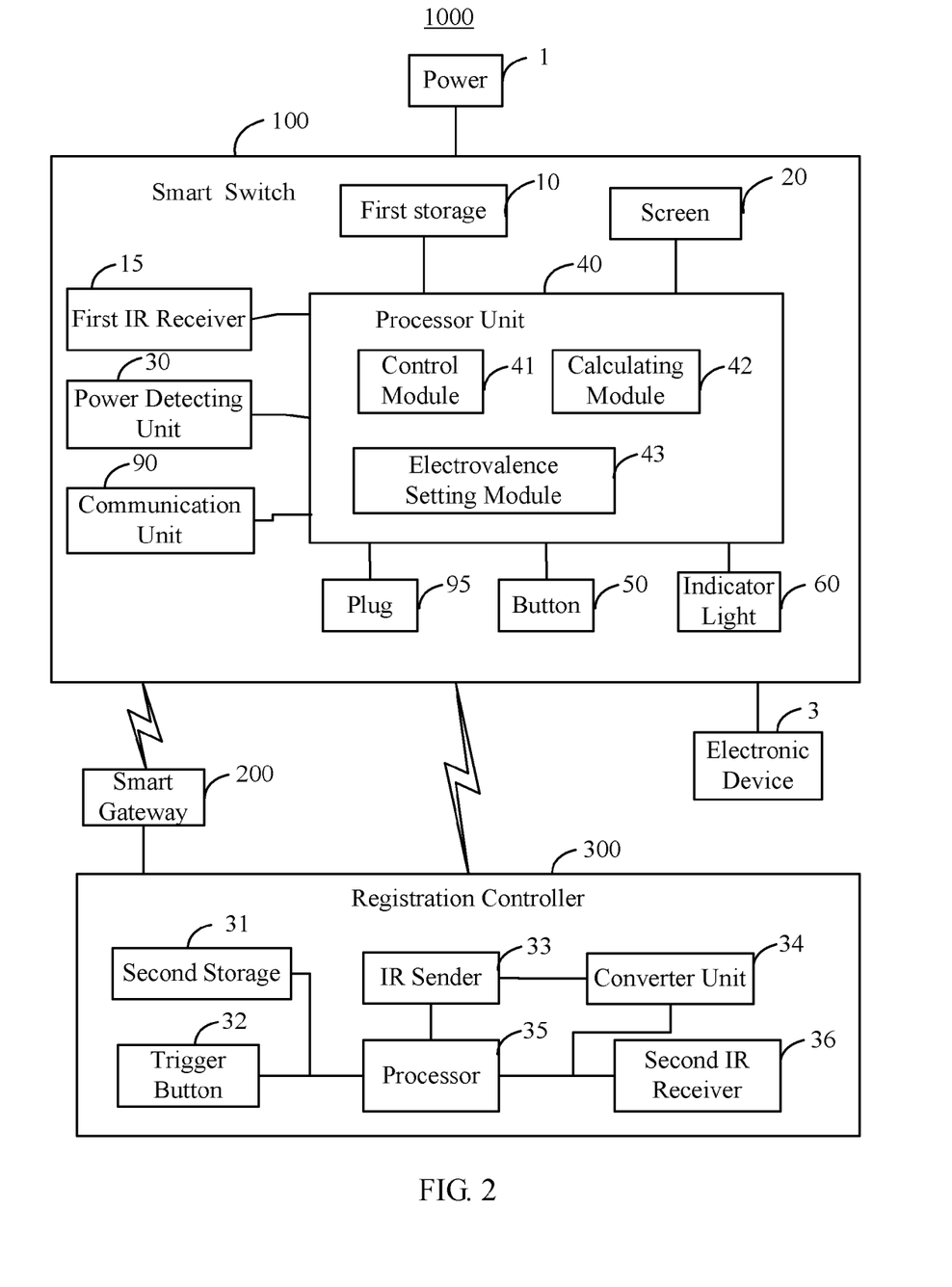
FIG. 2 is a block diagram of the smart home system of the FIG. 1.

Referring to FIGS. 1 and 2, a smart home system 1000 in accordance with a first embodiment is provided. FIG. 2 is a block diagram of the smart home system 1000. The smart home system 1000 includes a plurality of smart switches 100, a gateway 200 connected to the smart switches 100 via power line 2 (or optical fiber power line), a plurality of registration controllers 300 connected to the gateway 200 via power line 2 and a number of electronic devices 3 plugged to the smart switches 100. The electronic devices 3 can be home appliances. The registration controllers 300 are arranged in every room of a house employing the smart home system 100. The smart switch 100 is connected to the gateway 200 via wires or wirelessly, the wired mode can be Power Line Communication (hereinafter PLC), Optical Fiber Power Line Communication (hereinafter OPLC), wired internet communication, coaxial cable communication, telephone line communication, or other communication technologies.

Figure 4:
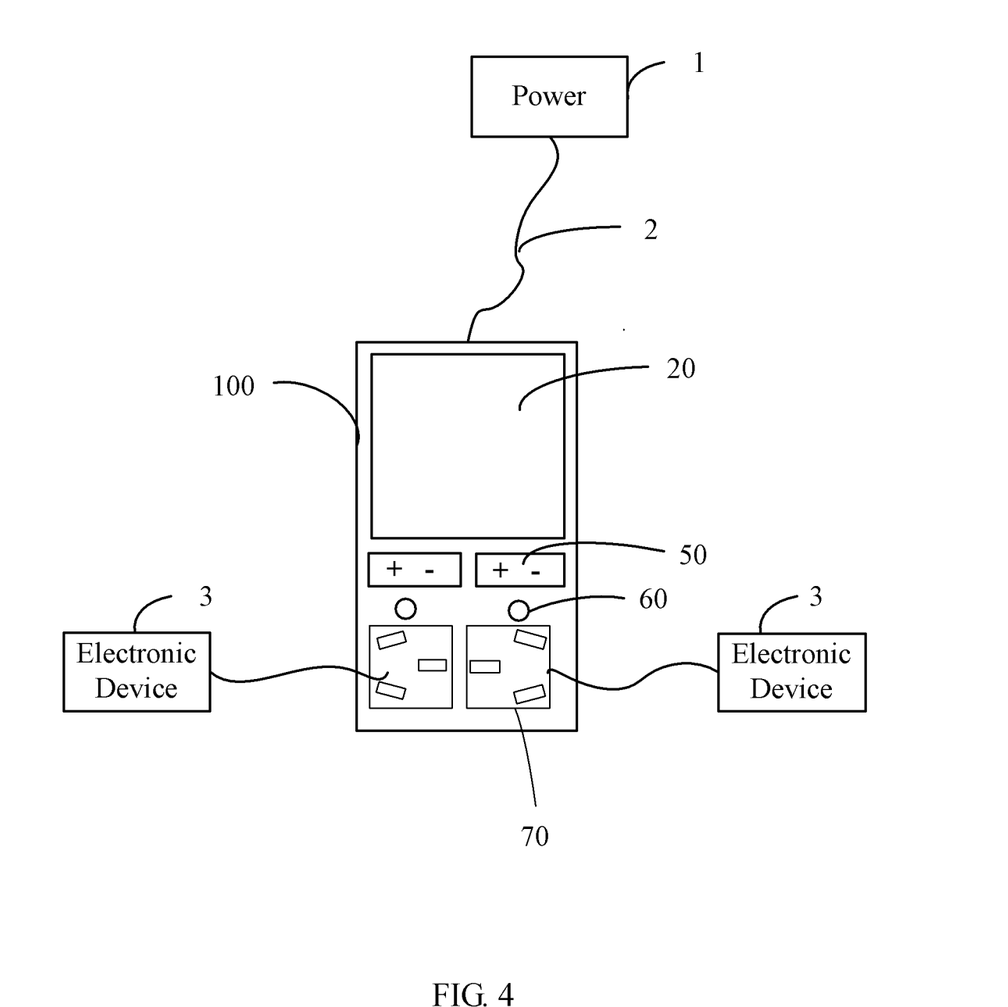
FIG. 4 is a schematic view showing a manner of connection between a smart switch and electronic devices according to a first embodiment
Figure 5:
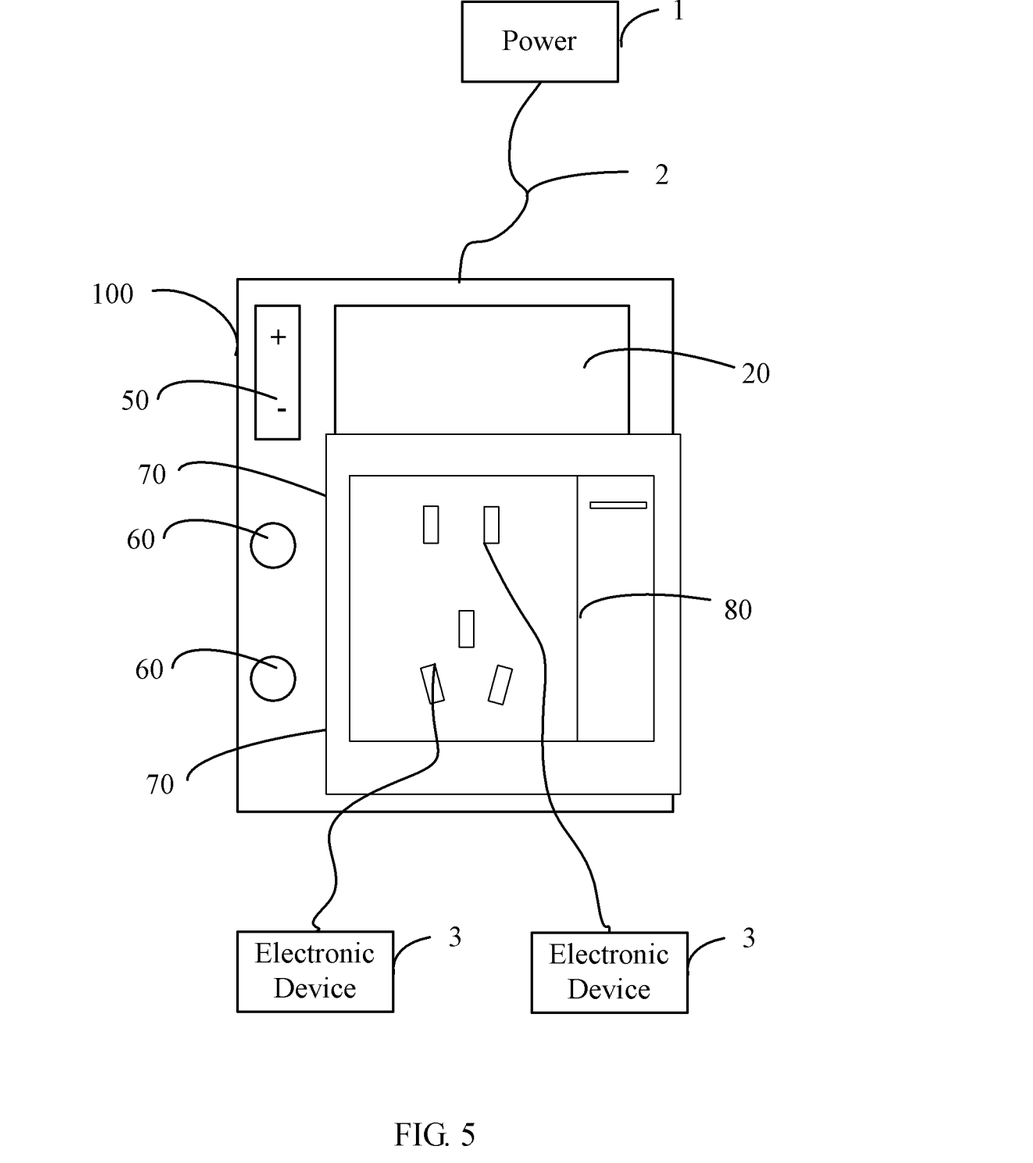
FIG. 5 is a schematic view showing a manner of connection between a smart switch and electronic devices according to a second embodiment.
Figure 6:
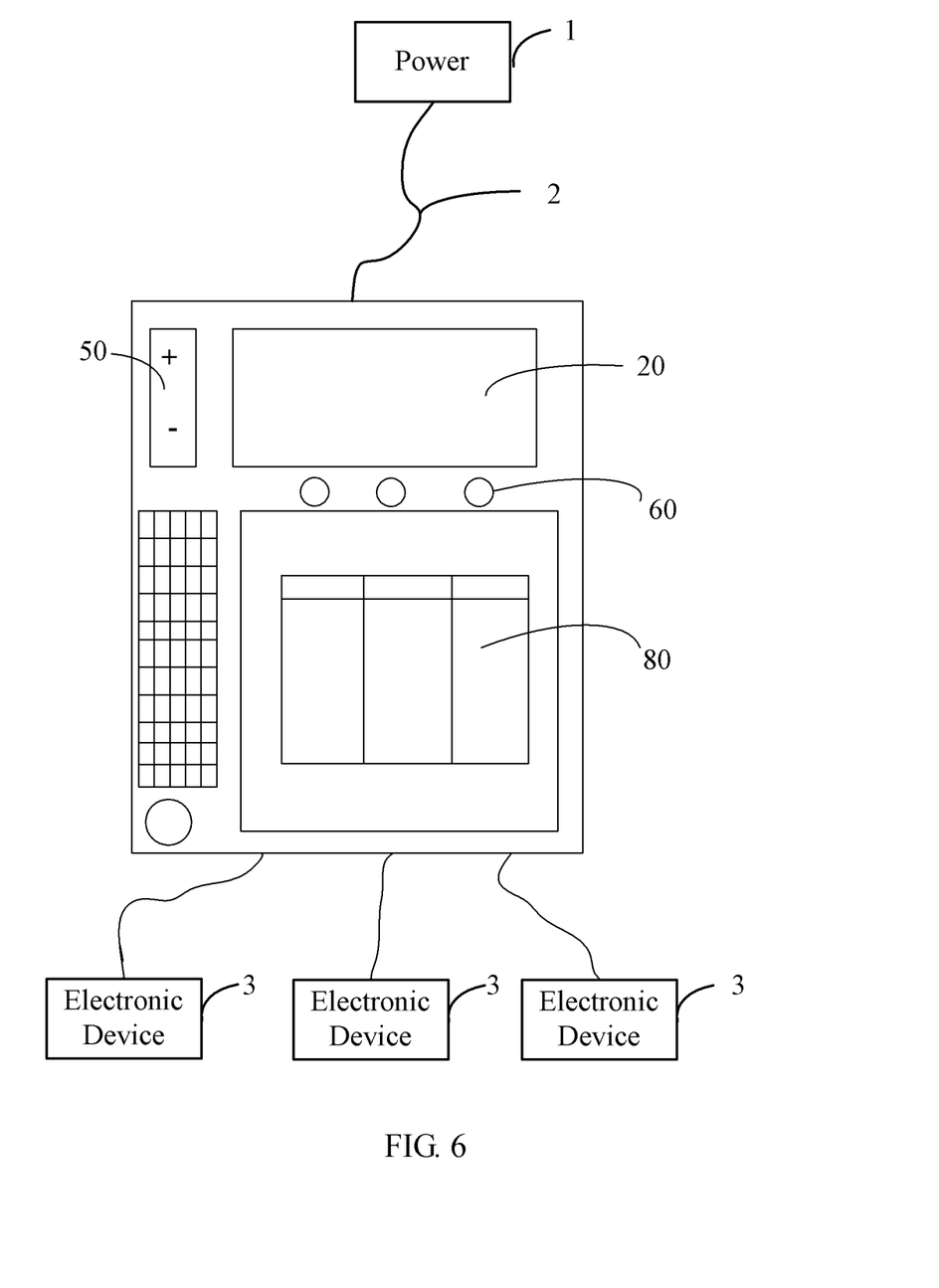
FIG. 6 is a schematic view showing a manner of connection between a smart switch and electronic devices according to a third embodiment

Referring to FIGS. 4-6, the smart switch 100 is connected to at least one electronic device 3 and a power supply 1. The smart switch 100 is capable of automatically detecting power state of the connected electronic devices 3, and displaying electricity consumption and energy charge of the connected electronic devices 3, to users. The smart switch 100 can be a switch including a display, or including a display and one or more socket.

Referring to FIGS. 1 and 2 again, the smart switch 100 includes a first storage 10, a screen 20, a power detecting unit 30 and a processor unit 40. The first storage 10, the screen 20 and the power detecting unit 30 are connected to the processor unit 40.

The smart switch 100 further includes a first infrared (IR) receiver 15 configured to receive IR signals sent by the registration controller 300. User can use the registration controller 300 to control the smart switches 100 in a room in which the registration controller 300 is located, to automatically register on the gateway 200. In detail, the smart switches 100 send a unique identification code (ID) to the gateway 200, to register on the gateway 200. In the first embodiment, the smart switch 100 includes a number of sockets, each of the sockets is assigned with a ID, the smart switches 100 further sends the IDs of the sockets to the gateway 200, thereby the sockets being registered on the gateway 200. Each of the registration controllers 300 also includes a ID stored therein.

A registration process of how the smart switches 100 register on the gateway 200 is explained.

Referring to FIG. 1, the gateway 200, the smart switches 100 and the registration controllers 300 are connected to the power line 2 (or optical fiber power line), and capable of communicating with each other via PLC (or OPLC). In this embodiment, the smart switches 100 include a smart switch A 100, a smart switch B 100, a smart switch C 100 and a smart switch D 100. The registration controllers 300 include a registration controller A 300, a registration controller B 300 and a registration controller D 300. The smart switch A 100 and the registration controller A 300 are located in a room A, the smart switch B 100, the smart switch C 100 and the registration controller B 300 are located in a room B, the smart switch D 100 and the registration controller D 300 are located in a room C. The gateway 200 can automatically communicate with all devices connected on the power line 2 (or optical fiber power line) via PLC (or OPLC).

Referring to FIG. 2, each registration controller 300 includes a second storage 31, a trigger button 32, an IR sender 33, a converter unit 34, a processor 35 and a second IR receiver 36. The registration controller 300 needs to be connected to the gateway 200, before the smart switches 100 register on the gateway 200. To connect the registration controller 300, the registration controller 300 is located within the communicating range of the gateway 200, and a connecting program is run on the smart gateway 200. Then, the smart gateway 200 establishes communication with the registration controller 300, and sends its ID and a secret code to the registration controller 300 wirelessly. The registration controller 300 receives and saves the ID of the gateway 200 and the secret code into the second storage 31. The registration controller 300 further sends its ID to the gateway 200 wirelessly, the gateway 200 receives and saves the ID of the registration controller 300, to finish the connecting process. In this embodiment, the registration controller 300 receives the ID of the gateway 200 and the secret code via the second IR receiver 36, and sends the ID of the registration controller 300 to the gateway 200 via the IR sender 33. In this embodiment, the secret code is the ID of the gateway 200, or the code input by the user. The secret code is configured to encode or decode the data transmitted between the gateway 200 and the registration controller 300, thus preventing access by unauthorized user. In other embodiments, the gateway 200 and the registration controller 300 can communicate via BLUETOOTH, Z-WAVE, NFC, ZIGBEE, WIFI, or other communication technologies.

If user wants to register the smart switches 100 on the gateway 200, user locates the connected registration controller 300 in the room which has the smart switches 100 needing to be registered, and run a registering program on the smart gateway 200.

For example, the registration controller B 300 shown in FIG. 1 is located in the room B, the smart switches B and C 100 are also located in the room B. The trigger button 32 generates a trigger signal in response to user pressing it, and sends the trigger signal to the processor 35. The processor 35 controls the IR sender 33 to send a registration request to the gateway 200, and send an IR signal in response to the trigger signal. The smart switches 100 arranged in the room B can receive the IR signal. In this embodiment, the registration controller B 300 sends the registration request to the gateway 200 via the power line 2 in response to the trigger signal. The IR signal includes the ID of the registration controller B 300, the ID of the gateway 200 and the secret code sent by the gateway 200. The smart switches B and C 100 store the ID of the registration controller B 300 and the secret code contained in the IR signal into the first storage 10. The registration request includes the ID of the registration controller B 300 and ID of the gateway 200.

The gateway 200 broadcasts a signal to all of the smart switches 100 connected on the power line for determining whether the smart switch 100 has received the IR signal sent by the registration controller 300, in response to the received registration request. The smart switches 100 which receive the IR signal send an encoded registration code to the gateway 200, in response to the broadcasting signal. In this embodiment, the smart switches 100 are registered on the gateway 200 in a driven registration manner.

In this example, the smart switches B and C 100 located in room B send an encoded registration code to the gateway 200, in response to the broadcast signal. The smart switches B and C 100 can send the encoded registration code to the gateway 200 via the power line. The registration code includes the ID of the smart switch 100 and the ID of the registration controller 300 stored in the first storage 10. If the smart switch 100 includes more than one socket, the registration code further includes the ID of each socket.

The gateway 200 decodes the registration code and determines whether or not the ID of the registration controller 300 contained in the registration code matches the ID of the registration controller 300 contained in the registration request; if yes, the gateway 200 stores the ID of the smart switch 100. In this way, the smart switch 100 is registered on the gateway 200, the gateway 200 can send control signals including the ID of the target smart switch 100, and the smart switch 100 determines whether the ID of the received control signal matches with their own ID, only the matching smart switch 100 can parse the control signals, thus creating a point-to-point communication between the gateway 200 and the smart switch 100.

In an embodiment, the converter unit 34 of the registration controller 300 is configured to receive the control signals from the power line 2 sent by the gateway 200 and convert the control signals. The IR sender 33 sends the converted control signals to the corresponding smart switch 100 to control the electronic device 3 connected on the smart switch 100.

In an embodiment, the smart switch 100 which receives the IR signal sends an encoded registration code to the gateway 200 directly. In this way, the smart switches 100 can be registered on the gateway 200 in a forward registration manner, instead of the driven registration manner mentioned before. The registration processes in the forward registration manner are the same as those of the driven registration manner and are not repeated here.

All the signals transmitted between the smart switches 100, the gateway 200 and the registration controller 300 via the power line 2 mentioned in disclosure, include the ID of the device which sends the signals and the ID of the device which receives the signals. Furthermore, a secret code is used to encode the signals transmitted between the smart switches 100, the gateway 200 and the registration controller 300 via the power line 2, and the secret code is stored in smart switches 100, the gateway 200 and the registration controller 300.

In an embodiment, the registration controller 300 has the same appearance and function of the smart switches 100, the difference between the registration controller 300 and the smart switches 100 is that the registration controller 300 further includes a trigger button 32 and an IR sender 33. The registration controller 300 not only serves to control the smart switches 100 to automatically register on the gateway 200, but also acts as a smart switch.

Figure 3:
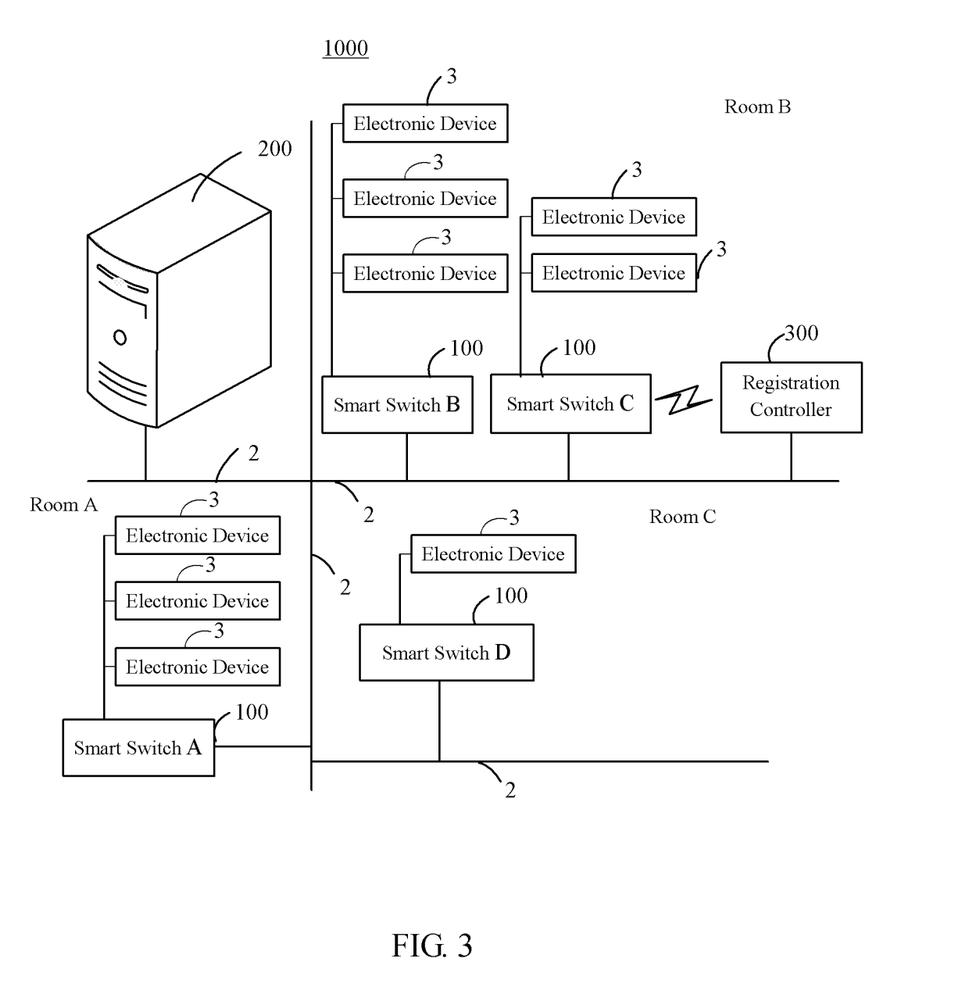
FIG. 3 is a schematic view showing a smart home system, according to another exemplary embodiment.

Referring to FIG. 3, in a second embodiment, only one registration controller 300 is employed in the smart home system 1000

The registration controller 300 is connected to the gateway 200, before the smart switches 100 register on the gateway 200, and the connection process is the same as mentioned in the first embodiment.

If user wants to register the smart switches 100 on the gateway 200, user must locate the connected registration controller 300 in the room in which the smart switches 100 need to be registered, and run a registering program on the smart gateway 200.

For example, the registration controller 300 shown in FIG. 3 is located in the room B, the smart switches B and C are also located in the room B. The trigger button 32 generates a trigger signal in response of user's pressing it, and sends the trigger signal to the processor 35. The processor 35 controls the registration controller 300 to send a registration request to the gateway 200. In this embodiment, the registration controller 300 sends the registration request to the gateway 200 via the power line 2 in response to the trigger signal. The gateway 200 generates a serial code and sends the serial code to the registration controller 300 in response to the registration request. In this embodiment, the gateway 200 sends the serial code to the registration controller 300 via the power line 2. The serial codes generated by the gateway 200 responding to the registration request are different every time, in this embodiment, the serial codes are generated according to the times of the received registration request. For example, for the gateway 200 receiving the registration request a first time, the gateway 200 generates a first serial code, such as 01; then for a second registration request, the gateway 200 generates a second serial code, such as 02.

The processor 35 of the registration controller 300 controls the IR sender 33 to send an IR signal in response to the received serial code, the IR signal includes the serial code, the ID of the registration controller 300, the ID of the gateway 200 and the secret code sent by the gateway 200. The smart switches B and C 100 can receive the IR signal. The smart switches B and C 100 store the serial code, the ID of the registration controller 300, and the secret code contained in the IR signal, into the first storage 10.

The gateway 200 further broadcasts signal to all of the smart switches 100 connected on the power line for determining whether the smart switch 100 has received the IR signal sent by the registration controller 300. The smart switches 100 which receive the IR signal send an encoded registration code to the gateway 200 via the power line 2, in response to the broadcast signal. In this embodiment, the smart switches 100 are registered on the gateway 200 in a driven registration manner.

In this embodiment, the smart switches B and C 100 arranged in room B send the encoded registration code to the gateway 200 in response to the broadcast signal. The registration code includes the serial code, the ID of the smart switch 100, and the ID of the registration controller 300 stored in the first storage 10. If the smart switch 100 includes more than one socket, the registration code further includes the ID of the each socket.

The gateway 200 decodes the registration code and determines whether the ID of the registration controller 300 contained in the registration code matches the ID of the registration controller 300 contained in the registration request; if yes, the gateway 200 stores the ID of the registration code. In this way, the smart switch 100 is registered on the gateway 200, the gateway 200 can send control signals including the ID of the target smart switch 100, and the smart switch 100 determines whether the ID of the received control signal matches their own ID, only the matching smart switch 100 can parse the control signals, thus creating a point-to-point communication between the gateway 200 and the smart switch 100.

Also, the smart switches 100 can be registered on the gateway 200 in a forward registration manner, the smart switch 100 which receives the IR signal sends an encoded registration code to the gateway 200 directly, and the other registration processes in the forward registration manner are the same as those of the driven registration manner, they are not repeated here.

The first embodiment and the second embodiment illustrate the connection registration process of the registration controller 300 in connecting to the gateway 200 and the registration process of the smart switches 100 registering on the gateway 200. After registering the smart switches 100 on the gateway 200, the gateway 200 is capable of sending a controlling signal to the smart switches 100, to control the electronic devices 3 which are connected to the smart switch 100.

Referring to FIG. 2, the smart switch 100 includes a first storage 10, a screen 20, a power detecting unit 30 and a processor unit 40. The first storage 10, the screen 20 and the power detecting unit 30 are connected to the processor unit 40.

A formula is stored in the first storage 10 for calculating the energy charge. The power detecting unit 30 is configured to detect real-time electricity information of the electronic devices 3 which are downstream of the smart switch 100, such as the voltage, current, or power of the electronic devices 3. The real-time electricity consumption of the electronic device 3 is equal to the product of the voltage and the current thereof. The power detecting unit 30 further sends the real-time electricity information to the processor unit 40. The screen 20 can be an LCD, an electronic paper display, an LED display, a touch display, or the like.

The processor unit 40 includes a control module 41 and a calculating module 42. The calculating module 42 calculates the total electricity consumption of the electronic device 3 according to their real-time power consumption. In an embodiment, the calculating module 42 obtains the power P of the electronic device 3 detected by the power detecting unit 30 at a pre-determined interval t, and calculates the electricity consumption of the electronic device 3 in this time period t by the product of the power P and the time period t, and the total electricity consumption of the electronic device 3 is equal to the sum of the electricity consumption of every time period t.

The calculating module 42 further calculates the energy charge of the electronic device 3 according to the formula stored in the first storage 10, an electrovalence and the total electricity consumption, the control module 41 further controls the screen 20 to display the energy charge.

The smart switch 100 further includes a button 50 connected to the processor unit 40. The button 50 sends a first signal to the processor unit 40 in response to being pressed a first time, the control module 41 of the processor unit 40 resets the total electricity consumption and the energy charge of the electronic device 3 displayed on the screen 20 in response to the first signal, and the calculating module 42 recalculates a total electricity consumption and an energy charge of the electronic device 3. The button 50 sends a second signal in response to being pressed a second time, to the processor unit 40, the control module 41 of the processor unit 40 controls the screen 20 to display an input box beside the total electricity consumption for receiving a new electrovalence input by a user. In an embodiment, the first pressing is a short press gesture, such as pressing for 0.5 seconds; and the second pressing is a longer press, such as pressing for more than 3 seconds. The processor unit 40 further includes an electrovalence setting module 43 configured to determine electrovalence according to current time period, namely the electrovalence is different in different time periods.

The smart switch 100 further includes an indicator light 60 connected to the processor unit 40, configured to indicate the power state of the electronic device 3. The control module 41 of the processor unit 40 controls the indicator light 60 to appear in different colors according to the real-time power detected by the power detecting unit 30. In an embodiment, in detail, the control module 41 controls the indicator light 60 to appear red when the real-time power of the electronic device 3 is higher than a preset maximum, such as a power rating, to indicate that the power consumption of the electronic device 3 is too large; the control module 41 controls the indicator light 60 to appear green when the real-time power of the electronic device 3 is within a normal power range; and the control module 41 controls the indicator light 60 to appear yellow when the real-time power of the electronic device 3 is lower than a preset minimum, to indicate the electronic device 3 is powered off, in a standby state, or in some other low power consuming state. Furthermore, the control module 41 controls the indicator light 60 to be off when the electronic device 3 is disconnected from the smart switch 100.

In an embodiment, the control module 41 of the processor unit 40 controls the indicator light 60 to appear in different colors according to energy charge of the electronic device 3 calculated by the calculating module 42. In detail, the control module 41 controls the indicator light 60 to appear red when the energy charge of the electronic device 3 is more than a preset maximum, to indicate that the energy charge of the electronic device 3 is too large; the control module 41 controls the indicator light 60 to appear green when the energy charge of the electronic device 3 is within a normal range, to indicate that the energy charge is within normal range.

In an embodiment, the smart switch 100 includes a communication unit 90 configured to connect the smart switch 100 to the gateway 200 in a wired or wireless fashion, to send the electricity information of the electronic device 3 to the gateway 200. The gateway 200 is capable of collecting and analyzing the data of the electricity information. The wireless communication includes, but is not limited to, INFRARED, BLUETOOTH, Z-WAVE, NFC, ZIGBEE, WIFI (Wireless Fidelity) or WAPI (Wireless LAN Authentication and Privacy Infrastructure) network, General Packet Radio Service (GPRS) network, the Code Division Multiple Access (CDMA) network, the $3^{rd}$ Generation (3G) Telecommunication network or the $4^{th}$ Generation (4G) Telecommunication network, or other communication technologies; the wired communication mode can be PLC, OPLC, wired Internet communication, coaxial cable communication, telephone line communication, or other communication technologies.

In an embodiment, the smart switch 100 further includes a plug 95 configured to connect the smart switch 100 to the power 1, thus connecting the power 1 and the electronic devices 3.

Referring to FIGS. 4 and 5, the smart switch 100 includes at least one socket 70 configured to connect to the plug of the electronic device 3. The socket 70 can be a three-phase or two-phase socket. In another embodiment, referring to FIG. 6, the smart switch 100 is a button switch or a rocker switch, without socket.

When two or more electronic devices 3 are connected on the smart switch 100 via the sockets 70, the power detecting unit 30 can detect the real-time electricity information of the electronic devices 3 and send respective real-time electricity information to the processor unit 40. The calculating module 42 calculates the total electricity consumption and the energy charge of the electronic device 3, and the control module 41 controls the screen 20 to display the real-time electricity information, the energy charge and the total electricity consumption of the electronic device 3. Correspondingly, the smart switch 100 includes a number of indicator lights 60, each of the indicator lights 60 is related to one socket 70 of the smart switch 100 and is configured to indicate the power state of the electronic device 3 connected by means of the related socket 70. The control module 41 of the processor unit 40 controls each of the indicator lights 60 to appear in different colors to indicate the power state of the electronic device 3 connected by the related socket 70. Also, the smart switch 100 includes a number of buttons 60, each of the buttons 60 is related to one of the smart switches 100 and is configured to reset the total electricity consumption and the energy charge of the electronic device 3 connected by the related socket 70.

In an embodiment, the smart switch 100 only includes one button 50, and when the button 50 is pressed, the control module 41 of the processor unit 40 resets the total electricity consumption and the energy charge of all of the electronic devices 3.

Referring to FIG. 4, the smart switch 100 connects to the power 1 via the power line 2, the smart switch 100 sends the electricity information of the electronic device 3 to the gateway 200 via the communication unit 90. In this embodiment, the smart switch 100 includes the same numbers of sockets 70, buttons 50 and indicator lights 60, each of the sockets 70 being related to one button 50 and one indicator light 60. As shown in FIG. 4, two sockets 70, two buttons 50 and two indicator lights 60 are illustrated, in other embodiments, the numbers of sockets 70, buttons 50 and indicator lights 60 can be three, or four or more. The sockets 70 are three-phase sockets configured to connect to three-phase electronic devices 3. The electronic devices 3 can be fridges, air-conditioners, computers, fans, TVs, lamps, micro wave ovens, and the like.

Referring to FIG. 5, the smart switch 100 is similar to the smart switch 100 shown in FIG. 4. The smart switch 100 shown in FIG. 5 includes two sockets 70, and a button 50. The smart switch 100 further includes a switch 80 configured to turn on or turn off the two sockets 70, the two sockets 70 are a two-phase socket 70 and a three-phase socket 70.

Referring to FIG. 6, the smart switch 100 is connected to three electronic devices 3, and includes three switches 80. Each of the three switches 80 is related to an indicator light 60 and a connected electronic device 3. The switch 80 is configured to turn on or turn off the power to the related electronic device 3.

Users can obtain the real-time electricity information, the total electricity consumption and the energy charge of the electronic device 3 from the screen 20, and the power state of the electronic device 3 via the indicator light 60.

Moreover, it is to be understood that the disclosure may be embodied in other forms without departing from the spirit thereof. Thus, the present examples and embodiments are to be considered in all respects as illustrative and not restrictive, and the disclosure is not to be limited to the details given herein.

What is claimed is:

1. A smart switch applied to a smart home system, the smart switch connecting to a power and at least one electronic device, the smart switch comprising:
    a screen;
    a power detecting unit configured to detect real-time electricity information of the electronic device connected on the smart switch;
    a processor unit connected to the screen and the power detecting unit, comprising a calculating module configured to calculate total electricity consumption of the electronic device according to the real-time electricity information, and a control module configured to control the screen to display the real-time electricity information and the total electricity consumption;
    a communication unit configured to connect the smart switch to a gateway of the smart home system in wired or wireless communication mode, and send the real-time electricity information and the total electricity consumption to the gateway a storage unit configured to store a formula and an electrovalence, wherein the calculating module further calculates energy charge of the electronic device according to the formula stored in the first storage, and the control module controls the screen to display the energy charge; and
    a button connected to the processor unit, configured to send a first signal to the processor unit in response to a first pressing gesture; wherein the control module resets the total electricity consumption and the energy charge of the electronic device displayed on the screen and the calculating module calculates the total electricity consumption and the energy charge of the electronic device in response to the first signal.

2. The smart switch as described in claim 1, wherein the button sends a second signal to the processor unit in response of a second pressing gesture, the control module controls the screen display an input box beside the total electricity consumption for receiving a new electrovalence input by a user in response of the second signal.

3. The smart switch as described in claim 2, further comprising a socket configured to connect a plug of the electronic device, wherein the socket is a three-phase socket or a two-phase socket.

4. The smart switch as described in claim 3, further comprising a switch related to the socket, the switch being configured to turn on or turn off the power of the socket.

5. The smart switch as described in claim 1, wherein the processor unit further comprises an electrovalence setting module configured to determine electrovalence according current time period.

6. The smart switch as described in claim 1, further comprising a plug configured to connect the smart switch to the power.

7. The smart switch as described in claim 1, further comprising an indicator light, wherein the control module controls the indicator light to appear different color according to the real-time power detected by the power detecting unit.

8. The smart switch as described in claim 7, wherein
the control module controls the indicator light to appear red when the real-time power of the electronic device is higher than a preset maximum power;
the control module controls the indicator light to appear green when the real-time power of the electronic device is within a normal power range;
the control module controls the indicator light to appear yellow when the real-time power of the electronic device is lower than a preset minimal power; and
the control module controls the indicator to light off when the electronic device is disconnected to the smart switch.

9. The smart switch as described in claim 7, wherein
the control module controls the indicator light to appear red when the energy charge of the electronic device is more than a preset maximum value; and
the control module controls the indicator light to appear green when the energy charge of the electronic device is within a normal range.

10. The smart switch as described in claim 7, wherein the screen is a LCD, E-paper display or an LED display.

11. The smart switch as described in claim 1, wherein the smart switch communicates with the gateway and a registration controller, the processor unit generates a registration code once receiving an Infrared signal from the registration controller, the Infrared signal contains a unique identification code of the registration controller and a unique identification code of the gateway, the registration code comprises a unique identification code of the smart switch and the unique identification code of the registration controller.

12. A smart home system comprising at least one smart switch and a gateway communicating to the smart switch with each other via Power Line Communication (PLC) or Optical Fiber Power Line Communication (OPLC), the smart switch connecting to a power and at least one electronic device, the smart switch comprising:
a screen;
a power detecting unit configured to detect real-time electricity information of the electronic device connected on the smart switch;
a processor unit connected to screen and the power detecting unit, comprising a calculating module configured to calculate total electricity consumption of the electronic device according to the real-time electricity information, and a control module configured to control the screen to display the real-time electricity information and the total electricity consumption;
a communication unit configured to connect the smart switch to a gateway of the smart home system in wired or wireless communication mode, and send the real-time electricity information and the total electricity consumption to the gateway a storage unit configured to store a formula and an electrovalence, wherein the calculating module further calculates energy charge of the electronic device according to the formula stored in the first storage, and the control module controls the screen to display the energy charge; and
a button connected to the processor unit, configured to send a first signal to the processor unit in response to a first pressing gesture; wherein the control module resets the total electricity consumption and the energy charge of the electronic device displayed on the screen and the calculating module calculates the total electricity consumption and the energy charge of the electronic device in response to the first signal.

13. The smart home system as described in claim 12, further comprising a registration controller communicating to the gateway via wired or wireless communication mode, wherein the gateway sends an identification code of the gateway and a secret code to the registration controller when the registration controller is located within the communicating range of the gateway, a mating program is run on the gateway, and the registration controller further send an identification code of the registration controller to the gateway.

14. The smart home system as described in claim 13, wherein the secret code is the identification code of the gateway or input by an user.

15. The smart home system as described in claim 13, wherein the gateway sends a broadcasting signal to the smart switch in response of the received registration request, the smart switch which has received the Infrared signal sends the registration code to the smart gateway in response of the broadcasting signal.

16. The smart home system as described in claim 15, wherein the registration controller comprises:
a second Infrared receiver configured to receive the identification code of the gateway and the secret code sent by the gateway;
a trigger button configured to generate a trigger signal in response of the user's pressing;
an Infrared sender; and
a processor configured to control the Infrared sender to send an Infrared signal comprising the identification code of the registration controller and the secret code, and control the registration controller to send a registering request to the gateway;
the smart switch further comprises a first Infrared receiver configured to receive the Infrared signal and a storage configured to save the Infrared signal, the smart switch further sends a registration code encoded by the secret code to the smart gateway, the registration code comprises the identification code of the smart switch and the identification code of the registration controller;
the gateway decodes the registration code and saves the identification code of the registration controller.

17. The smart home system as described in claim 16, wherein the smart switch comprises a socket, the registration code further comprises an identification code of the socket.

18. The smart home system as described in claim 16, wherein the smart switch comprises a plug configured to connect the smart switch to the power.

19. The smart home system as described in claim 12, wherein the smart switch communicates with the gateway and a registration controller, the processor unit generates a registration code once receiving an Infrared signal from the registration controller, the Infrared signal contains a unique identification code of the registration controller and a unique identification code of the gateway, the registration code comprises a unique identification code of the smart switch and the unique identification code of the registration controller.

\* \* \* \* \*